United States Patent [19]

Livingston, Jr.

[11] Patent Number: 4,670,622
[45] Date of Patent: Jun. 2, 1987

[54] SOLAR ENERGY CONVERSION APPARATUS AND METHOD

[76] Inventor: Miles R. Livingston, Jr., 1322 Cornish Dr., Oceanside, Calif. 92054

[21] Appl. No.: 908,612

[22] Filed: Sep. 18, 1986

[51] Int. Cl.$^4$ .................... H02N 6/00; H01L 25/02
[52] U.S. Cl. .................................. 136/246; 136/250; 310/66; 310/261; 310/273
[58] Field of Search .................... 136/246; 310/66, 26, 310/273

[56] References Cited

U.S. PATENT DOCUMENTS 3,252,023  5/1966  Schmidt ............................. 310/115
3,383,246  5/1968  Ferreira ............................. 136/246

Primary Examiner—Aaron Weisstuch
Attorney, Agent, or Firm—Duane C. Bowen

[57] ABSTRACT

Solar energy conversion apparatus including a rotatable converter with a core that is triangular in cross-section and tapers towards its ends. A multiplicity of hemispherical photovoltaic cells are supported on the sides of the core. Two metal foil layers insulated from each other are connected to different conductivity type portions of the cells, the outer foil layer being reflective. A glass shell covers the core and tapers toward each end. The shell has a dodecagonal cross-section with four facets overlying each side of the core, alternate facets being left uncovered and transparent and the other facets being silvered, thus forming reflective interior surfaces for reflection of sunlight entering the shell. A parabolic reflector directs sunlight on an end of the converter. A stationary housing concentric about the converter has a reflective inner surface in first and second end sections parallel to the taperings of the shell. The housing is divided into three sections each containing a field winding. Commutators at the ends of the converter electrically connect the foil layers to the field windings so that the converter will rotate when current passes from the cells, through the commutators, to the field windings. Upon rotation of the converter, sunlight is variously directed and reflected to the cells in a rapidly changing cycle. Output leads from the commutators provide for discharge of developed electrical energy.

18 Claims, 9 Drawing Figures

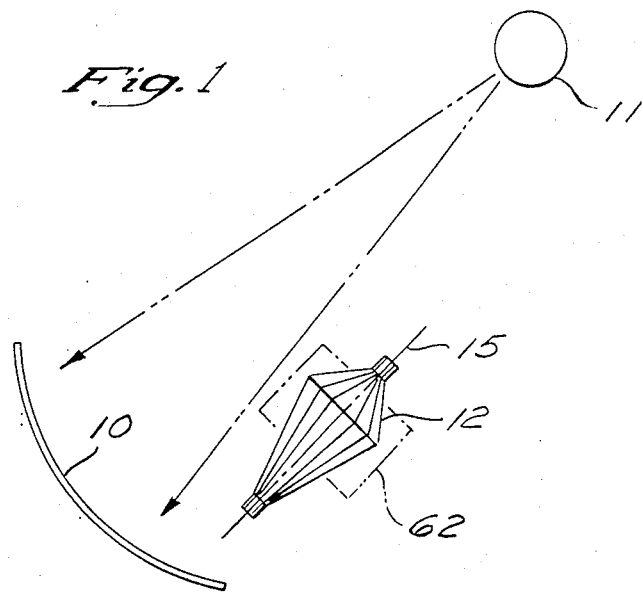
Fig. 1
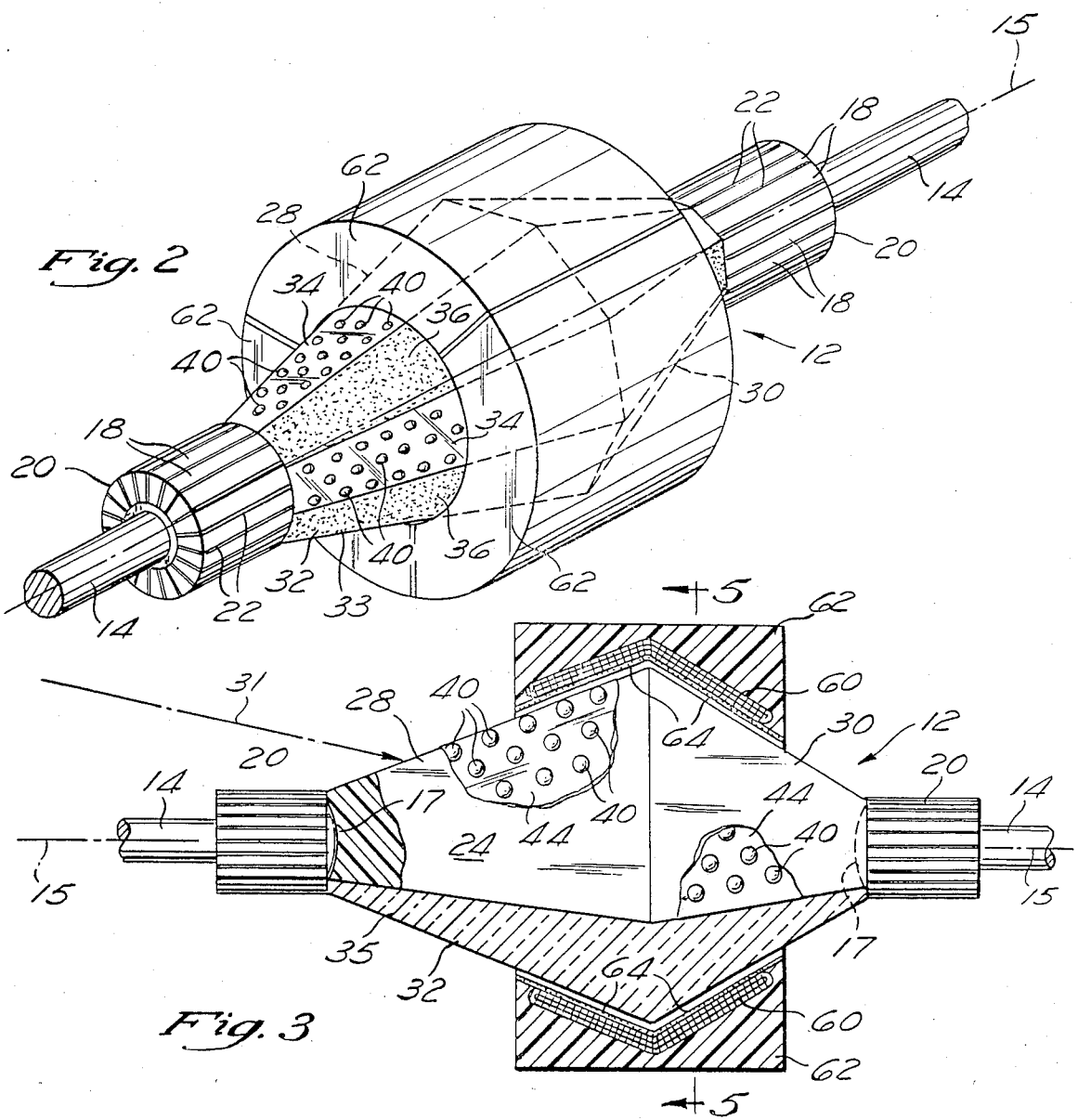
Fig. 2
Fig. 3

SOLAR ENERGY CONVERSION APPARATUS AND METHOD

BRIEF SUMMARY OF THE INVENTION, BACKGROUND AND OBJECTIVES

My invention relates to generation of power from the sun using photovoltaic cells.

One promising form of solar energy conversion, in general power production, is the use of photovoltaic cells. Costs of energy production using solar energy still exceeds costs of other energy production, such as using petroleum sources, for production of electricity for general commercial and residential power consumption.

An objective of my invention is to devise an apparatus and a method of solar energy conversion using photovoltaic cells in which maximum frequency of solar exposure of the cells is gained by rotation of the body on which the cells are mounted and by multiple reflective surfaces. Further objectives include the use of means such as a parabolic reflector to concentrate the rays of the sun and the use of electrical energy generated by the photovoltaic cells to power the rotation of the body upon which the cells are mounted in the manner of a direct current electric motor.

My invention will be best understood, together with additional advantages and objectives thereof, when read with reference to the drawings.

DRAWINGS

FIG. 1 is a schematical view indicating the sun, a parabolic reflector and an energy converter forming a specific embodiment of my invention. The field winding housing of the converter is shown in dashed lines.

FIG. 2 is an enlarged perspective view of the energy converter.

FIG. 3 is an elevational view of the converter, partly in section.

FIG. 6 is an enlarged view in perspective of one of the commutators.

DESCRIPTION

Figure 4:
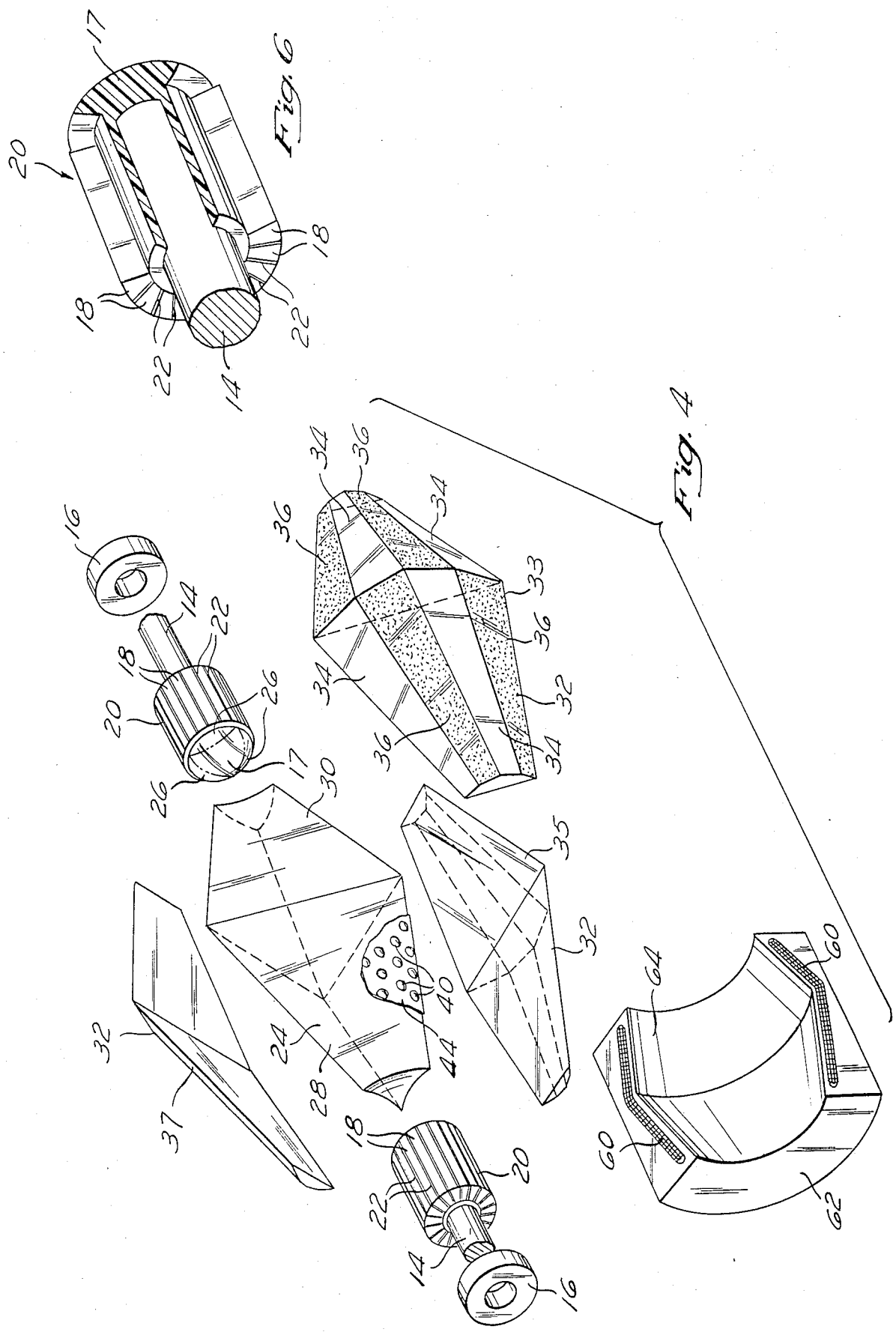
FIG. 4 is an exploded view of the converter, in perspective.

My apparatus includes sunlight concentration means 10 that concentrates sunlight and directs the sunlight towards a converter 12 at an acute angle to the longitudinal axis from an end of converter 12. The sunlight concentration means 10 in FIG. 1 is shown to be a parabolic reflector. The showing in FIG. 1 is schematical and does not show actual relative angles and relative positions of reflector 10, sun 11, and converter 12, and FIG. 1 does not show actual contours and details of reflector 10. Parabolic reflectors are a well established separate art. Another form of sunlight concentration means is a lens.

Referring to FIGS. 2–6, converter 12 has stub shafts 14 at its ends supported by bearings 16 so that converter 12 can rotate about its longitudinal axis. Plastic annuluses 17 at the ends of converter 12, receiving stub shafts 14, support metal segments 18 of commutators 20 separated by insulators 22.

Converter 12 has a plastic core 24. Core 24 is shown as a solid to simplify disclosure but in production core 24 will be made hollow, according to the practices of those skilled in plastic fabrication, in order to reduce the quantity of plastics required. The ends of core 24 are concave and the ends of plastic annuluses 17 are convex and are bonded together. Annuluses 17 being circular in end views and core 24 being triangular in end views, segments 26 of the ends of annuluses 17 are not covered by core 24 and are given reflective coatings to reflect sun rays striking segments 26.

Core 24 has triangular transverse cross-sections and core 24 tapers towards each end. Core 24 has a longer end 28 with sides making lesser angles with the core longitudinal axis 15 and core 24 has a shorter end 30 with sides making greater angles with the core longitudinal axis 15. Parabolic reflector 10 directs the reflected solar rays 31 onto the longer end 28 of core 24 at an acute angle to the longitudinal axis 15 of converter 12.

Core 24 is covered with a glass shell 32 which has three sections 33, 35, 37 corresponding to the three sides of core 24. Shell 32 tapers towards each end like core 28 does. In cross-section, shell 32 has four facets overlying each side of core 24 and the surfaces of the facets form a dodecagonal cross-section of shell 32 in cross-section. Alternate facets 34 are uncovered and transparent and the other facets 36 are silvered, forming reflective interior surfaces for reflection of sunlight entering shell 32. Transparent facets 34 in the longer end of shell 32 are aligned with silvered facets 36 in the shorter end of shell 32, and silvered facets 36 in the longer end are aligned with transparent facets 34 in the shorter end of shell 32.

Interposed between the outer surfaces of core 24 and the inner surfaces of shell 32 are a multiplicity of spaced generally hemispherical photovoltaic cells 40. Cells 40 are disposed on the planar outer surfaces of core 24 and the interior surfaces of shell 32 are formed to receive the outer generally hemispherical shapes of cells 40.

Figure 8:
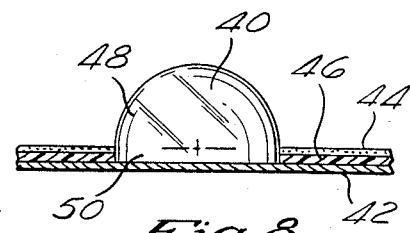
FIG. 8 is an elevational view, partly in section, of a photovoltaic cell assembly.
Figure 7:
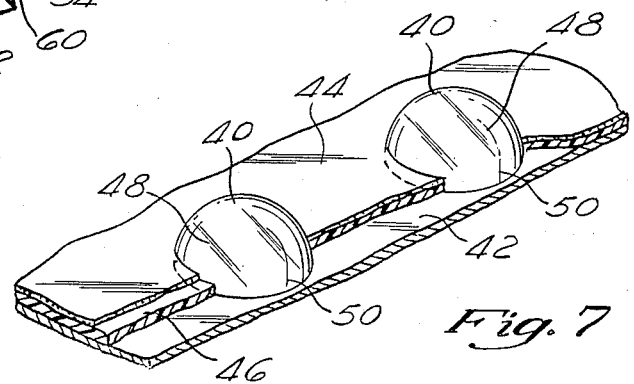
FIG. 7 is an enlarged, fragmentary perspective view of a photovoltaic cell assembly.

Referring now to FIGS. 7 and 8, sides of core 24 are blanketed with metal foil layers including an inner layer 42 and an outer layer 44 separated by an insulating ply 46. Outer ply 44 is given a reflective outer surface. A first portion 48 of each cell 40 is of a first conductivity type (p- or n-) and a second portion 50 of each cell 40 is of a second conductivity type (n- or p-). Inner foil layer 42 contacts first portions 48 of cells 40 and outer foil layer 44 contacts second portions 50 of cells 40. The material selections and techniques of processing, joining, laminating, bonding, etc., metal plies 42, 44, insulating ply 46, and so forth may follow those set forth in U.S. Pat. Nos. 4,407,320 and 4,521,640, John D. Levine inventor, assigned to Texas Instruments, Incorporated.

Figure 9:
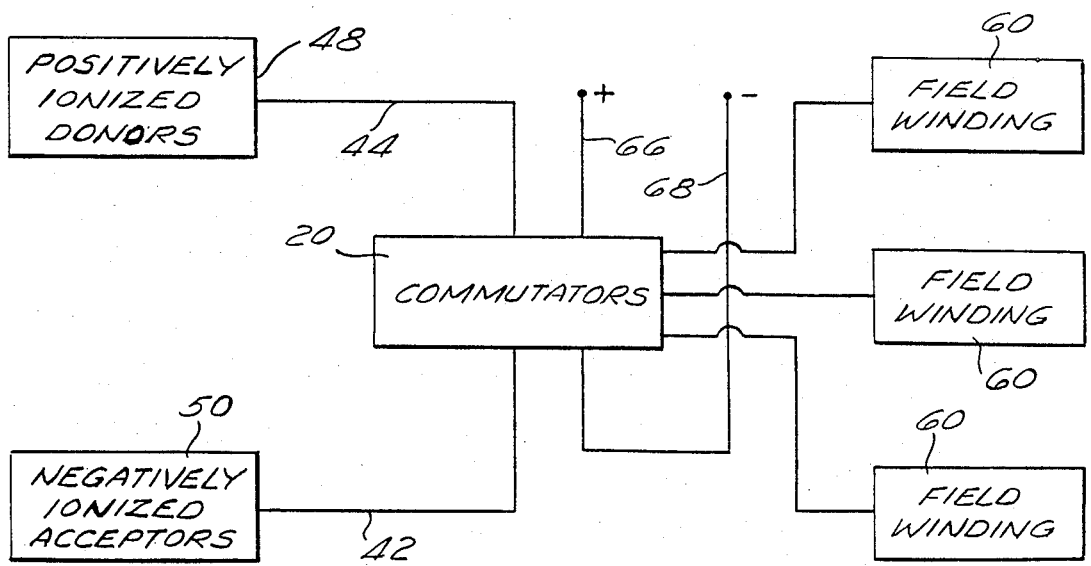
FIG. 9 is a diagrammatical view of the electrical system of the energy converter.

Current produced by photovoltaic cells 40 is used to power rotation of converter 12 in the manner of a direct current motor. Foils 42, 44 act as leads of opposite polarities to commutators 20. FIG. 9 is a diagrammatical presentation of electrical motor relationships. If photovoltaic cell first conductivity type 48 is positive and if photovoltaic cell second conductivity type 50 is negative, inner foil 42 acts as a negative lead to commutators 20 and outer foil 44 acts as a positive lead to commutators 20. Although two commutators 20 are shown, on either end of converter 12, one commutator 20 would be sufficient. Each commutator 20 has a series of metal segments 18 separated by insulation layers 22. Preferably each segment 18 extends fifteen degrees. Pickup from commutators 20 of course is by brushes which are not shown inasmuch as commutators and most other aspects of direct current motorization of converter 12 can follow standard designs of direct current motors.

Figure 5:
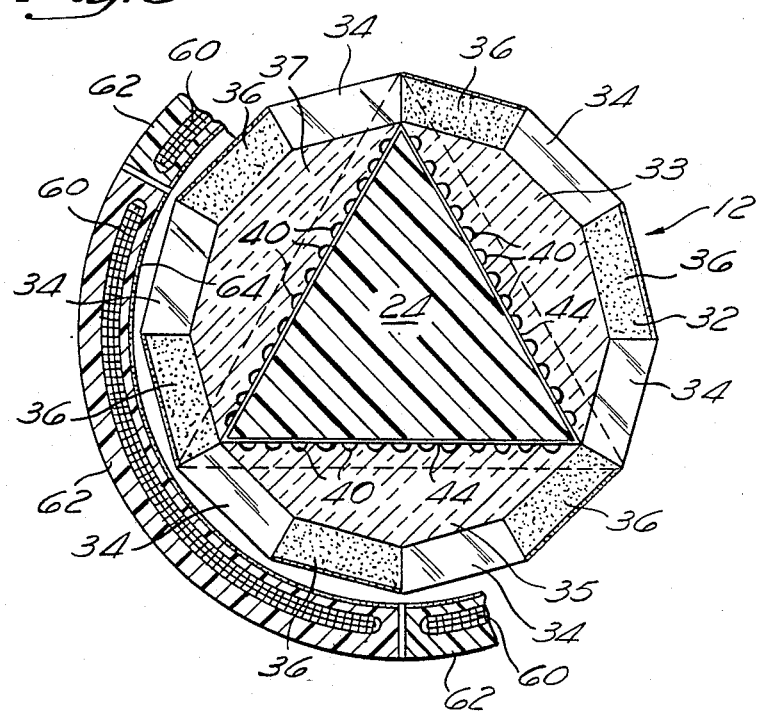
FIG. 5 is an enlarged view primarily in section taken on line 5—5 of FIG. 3.

Three field windings 60 are indicated in FIG. 9 mounted in three housing segments 62 shown in more detail in FIGS. 4 and 5. Any use of permanent magnets can follow common direct current motor designs. The inner surfaces 64 of housing segments 62 are silvered to reflect solar rays and redirect them back to converter 12.

Generated electrical energy from this solar energy system can be taken off through the leads 66, 68 shown in FIG. 9.

Cells 40 of the photovoltaic cell module are outwardly domed and are generally hemispherical as depicted especially in FIGS. 7 and 8.

Windings 62 and their housings are stationary and the converter glass shell 34 and plastic core 24, etc., rotate therein. Some electrical energy generated by photovoltaic cells 40 is used to energize field windings 60 and to power rotation of converter 12. The remaining electrical energy produced is led off through leads 66,68.

The photovoltaic system is characterized by maximizing frequency of solar energy exposure of cells 40 due to rapid rotation of converter 12 relative to the initial direction 31 of solar energy rays and due to multiple reflection of rays (a) on silvered facets 36 inside glass shell 32, (b) on the reflective outer foil layer 44, (c) on the reflective segments 26 at the ends of plastic annuluses 17, and (d) on the inner silvered surfaces 64 of housing segments 62.

Having thus described my invention, I do not wish to be understood as limiting myself for the exact construction shown and described. Instead, I wish to cover those modifications of my invention that will occur to those skilled in the art upon learning of my invention and which are within the proper scope thereof.

I claim:

1. Solar energy conversion apparatus, comprising:
   (a) an elongated converter and bearings supporting said converter so that said converter can rotate about its longitudinal axis,
   (b) said converter having a plastic core that is triangular in cross-section and tapers towards each end, the sides of said core supporting a multiplicity of spaced generally hemispherical photovoltaic cells, a first portion of each cell being of a first conductivity type and a second portion of each cell being of a second conductivity type and the sides of said core having first and second metal foil layers insulated from each other and respectively contacting said first and second portions of said cells, the outer metal foil layer having a reflective outer surface,
   (c) a glass shell covering said core and tapering toward each end, said shell having a dodecagonal cross-section with four facets overlying each side of said core, alternate facets being left uncovered and transparent and the other facets being silvered, thereby forming reflective interior surfaces for reflection of sunlight entering said shell,
   (d) sunlight concentration means operative to direct sunlight towards said converter at an acute angle to said longitudinal axis from an end of said converter, and
   (e) a stationary annular housing spaced concentrically around the generally central area of said converter and having a reflective interior surface in first and second end sections generally parallel to the taperings of said shell, said housing having three sections divided on planes coinciding at said longitudinal axis and each section containing a field winding, commutators at the ends of said converter electrically connected to said foils and to said field windings whereby upon passing of current from said cells to said foils and through said commutators to said field windings said converter will be impelled to rotate so that sunlight will be variously directed and reflected to said cells in a rapidly changing cycle, and output leads from said commutators for discharge of developed electrical energy.

2. The apparatus of claim 1 in which said shell has a longer end tapering at a lesser angle towards said sunlight concentration means and a shorter end tapering at a greater angle in the opposite direction, transparent facets in the longer end being aligned with silvered facets in the shorter end of said shell and silvered facets in the longer end being aligned with transparent facets in the shorter end of said shell.

3. The apparatus of claim 1 in which said sunlight concentration means is a parabolic reflector.

4. The apparatus of claim 1 in which said cells are outwardly domed.

5. The apparatus of claim 1 in which said commutators are divided into fifteen degree segments, the end portions of said commutators abutting said shell having reflective surfaces.

6. Solar energy conversion apparatus, comprising:
   (a) a converter and bearings supporting said converter at its ends so that said converter can rotate about its longitudinal axis,
   (b) said converter having a core with sides supporting a photovoltaic cell module,
   (c) a shell of transparent material covering said core, said shell having a series of juxtaposed areas extending longitudinally of said converter alternating between first areas that are transparent to admit sunlight to the interior of said shell and second areas that are coated, thereby forming reflective interior surfaces for reflection of sunlight entering said shell,
   (d) sunlight concentration means operative to direct sunlight towards said converter at an acute angle to said longitudinal axis from an end of said converter, and
   (e) a stationary housing around the generally central area of said converter having a reflective interior surface, said housing containing a field winding, commutator means at least at one end of said converter electrically connected to said module to receive electrical energy therefrom and said commutator means being electrically connected to said field winding whereby upon passing of current from said module through said commutator means to said field winding said converter will be impelled to rotate so that sunlight will be variously directed and reflected to said cells in a rapidly changing cycle, and output leads from said commutator means for discharge of developed electrical energy.

7. Solar energy conversion apparatus, comprising:

(a) a converter and bearings supporting said converter at its ends so that said converter can rotate about its longitudinal axis,
(b) said converter having a core with sides supporting a photovoltaic cell module,
(c) sunlight concentration means operative to direct sunlight on said converter, and
(d) a stationary field winding means disposed alongside said converter, commutator means at least at one end of said converter electrically connected to said module to receive electrical energy therefrom and said commutator means being electrically connected to said field winding means whereby upon passing of current from said module through said commutator means to said field winding means said converter will be impelled to rotate so that sunlight will be variously directed and reflected to said cells in a rapidly changing cycle, and output leads from said commutator means for discharge of developed electrical energy.

8. The apparatus of claim 7 in which said core is plastic and is triangular in cross-section and tapers towards each end.

9. The apparatus of claim 8 in which there is a glass shell covering said core and tapering towards each end, said shell having a dodecagonal cross-section with four facets overlying each side of said core, alternate facets being left uncovered and transparent and the other facets being coated to form reflective inner surfaces for reflection of sunlight entering said shell.

10. The apparatus of claim 7 in which said core is polygonal in cross-section and tapers towards each end, a shell of transparent material covering said core and tapering towards each end, said shell having a polygonal cross-section with a plurality of facets overlying each side of said core, alternate facets being left uncovered and transparent and the other facets being coated to form reflective inner surfaces for reflection of sunlight entering said shell.

11. The apparatus of claim 10 in which said shell has a longer end tapering at a lesser angle towards said sunlight concentration means and a shorter end tapering at a greater angle in the opposite direction, transparent facets in the longer end being aligned with coated facets in the shorter end of said shell and coated facets in the longer end being aligned with transparent facets in the shorter end of said shell.

12. The apparatus of claim 7 in which said sunlight concentration means is a parabolic reflector.

13. The apparatus of claim 7 in which said photovoltaic cell module includes a multiplicity of spaced domed cells, a first portion of each cell being of a first conductivity type and a second portion of each cell being of a second conductivity type and the sides of said core having first and second electrically conductive layers insulated from each other and respectively connected to said first and second portions of said cells.

14. The apparatus of claim 13 in which the surface of said core around said cells is reflective.

15. The apparatus of claim 14 in which the end portion of said commutator means adjacent said converter has reflective surfaces.

16. The apparatus of claim 7 in which there is a stationary annular housing spaced concentrically around the generally central area of said converter and having a reflective interior surface, said housing having three sections divided on planes coinciding at said longitudinal axis and said field winding means including a portion in each section of said housing, commutator means at least at one end of said converter electrically connected to said module and to said field winding means whereby upon passing of current from said module through said commutator means to said field winding means said converter will be impelled to rotate so that sunlight will be variously directed and reflected to said module in a rapidly changing cycle, and output leads from said commutator means for discharge of developed electrical energy.

17. The method of solar energy conversion, comprising:
(a) providing a converter with sides supporting a photovoltaic cell module so that said module can rotate about its longitudinal axis,
(b) concentrating and directing sunlight toward said converter at an acute angle to said longitudinal axis from an end of said converter,
(c) providing field winding means alongside said converter and directing electrical energy from said module to said field winding means to rotate said converter so that said module will be variously exposed to said sunlight and reflecting said sunlight on said module with multiple reflective surfaces in a rapidly changing cycle, and
(d) drawing electrical energy from said converter.

18. The method of solar energy conversion, comprising:
(a) providing a converter with sides supporting a photovoltaic cell module so that said module can rotate about its longitudinal axis,
(b) concentrating and directing sunlight toward said converter at an acute angle to said longitudinal axis from an end of said converter,
(c) rotating said converter so that said module will be variously exposed to said sunlight and reflecting said sunlight on said module with multiple reflective surfaces in a rapidly changing cycle, and
(d) drawing electrical energy from said converter.

* * * * *